United States Patent
Lee et al.

(10) Patent No.: US 9,472,465 B2
(45) Date of Patent: Oct. 18, 2016

(54) METHODS OF FABRICATING INTEGRATED CIRCUITS

(71) Applicant: GLOBALFOUNDRIES, Inc., Grand Cayman, KY (US)

(72) Inventors: Bongki Lee, Austin, TX (US); Jin Ping Liu, Hopewell Junction, NY (US); Bharat Krishnan, Clifton Park, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 14 days.

(21) Appl. No.: 14/270,824

(22) Filed: May 6, 2014

(65) Prior Publication Data

US 2015/0325681 A1 Nov. 12, 2015

(51) Int. Cl.
*H01L 21/8238* (2006.01)
*H01L 29/66* (2006.01)

(52) U.S. Cl.
CPC ....... *H01L 21/823842* (2013.01); *H01L 29/66* (2013.01); *H01L 29/66477* (2013.01)

(58) Field of Classification Search
None
See application file for complete search history.

(56) References Cited

U.S. PATENT DOCUMENTS

| 7,344,929 B2 | 3/2008 | Mehrotra et al. | |
|---|---|---|---|
| 8,629,028 B2 | 1/2014 | Baiocco et al. | |
| 8,765,546 B1 * | 7/2014 | Hung et al. | 438/222 |
| 2009/0152636 A1 * | 6/2009 | Chudzik | H01L 21/82384 257/369 |
| 2011/0254063 A1 * | 10/2011 | Chen et al. | 257/288 |
| 2013/0295739 A1 | 11/2013 | Hsiao et al. | |
| 2014/0077313 A1 * | 3/2014 | Li et al. | 257/410 |
| 2014/0145263 A1 * | 5/2014 | Cheng et al. | 257/347 |
| 2014/0213048 A1 * | 7/2014 | Sun et al. | 438/592 |

OTHER PUBLICATIONS

U.S. Appl. No. 13/539,837 Entitled "Methods for Fabricating Integrated Circuits Having Improved Metal Gate Structures". filed on Jul. 2, 2012.
U.S. Appl. No. 13/689,844 Entitled, "Methods for Fabricating Integrated Circuits Having Low Resistance Metal Gate Structures". filed on Nov. 30, 2012.
U.S. Appl. No. 13/943,909 Entitled, "Methods for Forming Integrated Circuits With Reduced Replacement Metal Gate Height Variability". filed on Jul. 17, 2013.

* cited by examiner

*Primary Examiner* — Anthony Ho
*Assistant Examiner* — Kevin Quinto
(74) *Attorney, Agent, or Firm* — Lorenz & Kopf, LLP

(57) ABSTRACT

Integrated circuits and methods for fabricating integrated circuits are provided. In an embodiment, a method is provided for fabricating an integrated circuit. The method includes forming a first FET trench in a first FET region and a second FET trench in a second FET region of an interlayer dielectric material on a semiconductor substrate, at least partially filling the first and second FET trenches with a work function metal to form a work function metal layer, and at least partially removing a portion of the work function metal layer in the second FET trench. The first FET trench is defined as an NFET trench and the second FET trench is defined as a PFET trench.

14 Claims, 7 Drawing Sheets

METHODS OF FABRICATING INTEGRATED CIRCUITS

TECHNICAL FIELD

The technical field generally relates to methods of fabricating integrated circuits, and more particularly relates to methods of fabricating integrated circuits by removing at least a portion of a work function metal to define an NFET trench and a PFET trench.

BACKGROUND

Transistors such as metal oxide semiconductor field effect transistors (MOSFETs), or simply field effect transistors (FETs), or MOS transistors are important building blocks of the vast majority of semiconductor integrated circuits (ICs). An FET includes source and drain regions between which a current can flow through a channel under the influence of a bias applied to a gate electrode that overlies the channel. Some semiconductor ICs, such as high performance microprocessors, can include millions of FETs. For such ICs, decreasing transistor size and thus increasing transistor density has traditionally been a high priority in the semiconductor manufacturing industry. Generally, transistor performance is maintained even as the transistor size decreases.

Often, transistors have metal gate structures utilizing tungsten as a metal fill portion in conjunction with a titanium nitride (TiN) P-type work function metal layer, and/or a tantalum carbide (TaC) or a titanium carbide (TiC) N-type work function metal layer. Usually, the tungsten metal fill portion is used as a conductive metal fill to offset the relatively higher resistance of the work function metal layer(s), particularly TaC or TiC for N-type work function metal, to lower the overall resistance of the metal gate structure. The use of different materials for P-type work function metal layers and N-type work function metal layers complicates manufacturing of P-channel FET (PFET) and N-channel FET (NFET) devices.

Furthermore, oxidation can affect gate layers by increasing the threshold voltage to attain effective work function, particularly for NFET devices. A relatively thin layer of a work function metal, which is usually desired to decrease transistor size, may be susceptible to oxidation, which can impede effective work function at targeted threshold voltages.

Accordingly, it is desirable to provide integrated circuits and methods for fabricating such integrated circuits that use a single metal for both P-type and N-type work function metal layers. Moreover, it is desirable to provide integrated circuits and methods for fabricating such integrated circuits that use a work function metal layer having sufficient thickness so as to not adversely affect work function due to oxidation. Furthermore, other desirable features and characteristics of the present invention will become apparent from the subsequent detailed description of the invention and the appended claims, taken in conjunction with the accompanying drawings and the background of the invention.

BRIEF SUMMARY

Integrated circuits and methods for fabricating integrated circuits are provided. In accordance with an exemplary embodiment, a method is provided for fabricating an integrated circuit. The method includes forming a first FET trench in a first FET region and a second FET trench in a second FET region of an interlayer dielectric material on a semiconductor substrate, at least partially filling the first and second FET trenches with a work function metal to form a work function metal layer, and at least partially removing a portion of the work function metal layer in the second FET trench. The first FET trench is defined as an NFET trench and the second FET trench is defined as a PFET trench.

In accordance with another exemplary embodiment, a method is provided for fabricating an integrated circuit. The method includes forming an NFET trench in an NFET region and a PFET trench in a PFET region of an interlayer dielectric material on a semiconductor substrate, at least partially filling the NFET and PFET trenches with a work function metal including at least one of titanium carbide or titanium aluminum carbide to form a work function metal layer, and at least partially removing a portion of the work function metal layer in the PFET trench to obtain a P-type work function metal layer.

In accordance with a further exemplary embodiment, a method is provided for fabricating an integrated circuit. The method includes forming an NFET trench in an NFET region and a PFET trench in a PFET region of an interlayer dielectric material on a semiconductor substrate, at least partially filling the NFET and PFET trenches with a work function metal including at least one of titanium carbide or titanium aluminum carbide to form a work function metal layer, at least partially removing a portion of the work function metal layer in the PFET trench to obtain a P-type work function metal layer, and at least partially filling the NFET and PFET trenches with work function metal including at least one of titanium carbide or titanium aluminum carbide to form another work function metal layer including a first layer having a thickness of about 40 to about 60 Å, and a second layer having a thickness of about 20 to about 40 Å in the NFET trench.

BRIEF DESCRIPTION OF THE DRAWINGS

The present invention will hereinafter be described in conjunction with the following drawing figures, wherein like numerals denote like elements, and wherein.

DETAILED DESCRIPTION

Figure 1:
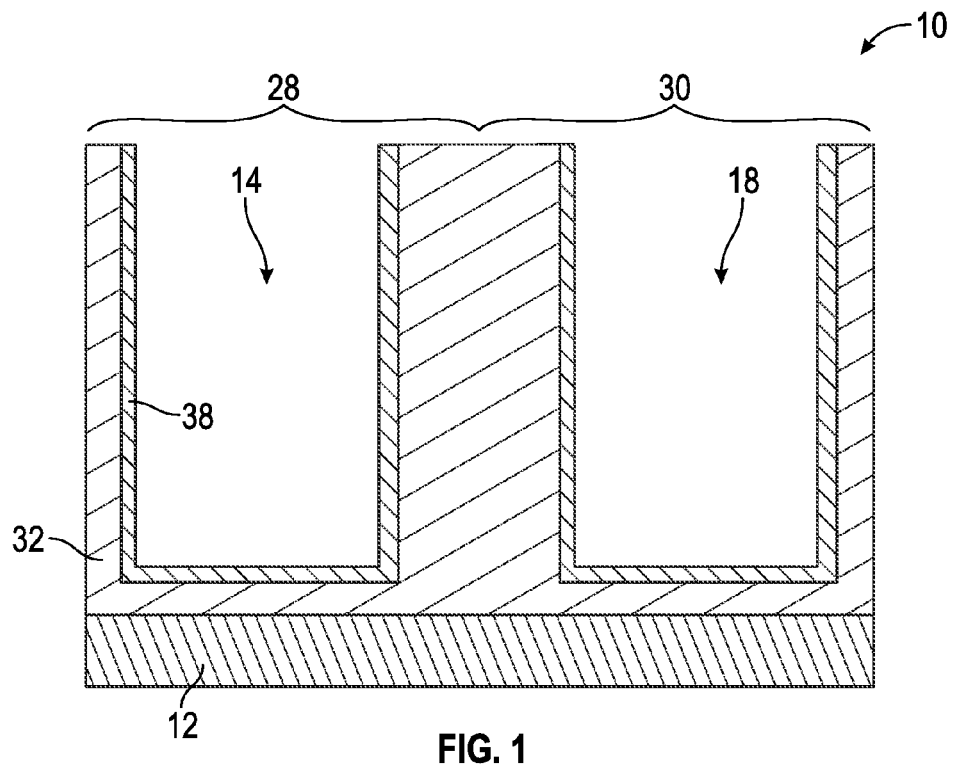
FIGS. 1-7 illustrate, in cross-section, an integrated circuit and a method for fabricating the integrated circuit according to an exemplary embodiment.

The following detailed description is merely exemplary in nature and is not intended to limit the invention or the application and uses of the invention. Furthermore, there is no intention to be bound by any theory presented in the preceding background or the following detailed description.

Conventional techniques related to semiconductor device fabrication are well known and so, for the sake of brevity, many such steps may not be described in detail herein. Moreover, the various tasks and process steps described herein may be incorporated into a more comprehensive procedure or process having additional steps or functionality not described in detail herein. In particular, various steps in the manufacture of semiconductor-based transistors are well known and so, in the interest of brevity, many conventional steps will only be mentioned briefly herein or will be omitted entirely without providing the well-known process details.

Various embodiments contemplated herein relate to methods for fabricating integrated circuits having improved metal gate structures. In many embodiments, the integrated circuits include a source side and a drain side. The distance from a source side to a drain side is no more than about 22 nanometer (nm), for example, about 14 nm, and even about 10 nm. In accordance with one embodiment, during intermediate stages of the fabrication of an integrated circuit (IC), a first FET trench, e.g., an NFET trench and a second FET trench, e.g., a PFET trench is formed in an NFET region and a PFET region, respectively, of an interlayer dielectric material on a semiconductor substrate. Work function metal is deposited overlying the NFET and PFET regions to partially fill the NFET and PFET trenches and form a work function metal layer. In embodiments, the work function metal is a conductive work function metal including at least one of titanium carbide or titanium aluminum carbide. The same work function metal may be used for both the NFET and PFET trenches by using work function metal layers of different thicknesses. Using a single recessing process, portions of the work function metal layers are recessed in the NFET and PFET trenches. An insulator is deposited in the recesses to form a passivation layer, which is for protection from oxidation of the work function metal and preventing shorts between the gate to source/drain. In the drawings, material is shown deposited only in the trenches. What is omitted from the drawings is the removal of a material outside the trenches using any suitable process, such as chemical mechanical planarization to obtain a planarized surface. The removal may be done at any suitable interval, such as after the depositing of each layer, a plurality of layers, or at the end of the process to remove all layers outside of the trenches.

FIGS. 1-13 illustrate methods for fabricating an IC 10 including a first embodiment in FIGS. 1-7 and a second embodiment in FIGS. 8-13. The described process steps, procedures, and materials are to be considered only as exemplary embodiments designed to illustrate to one of ordinary skill in the art methods for practicing the embodiments; the invention is not limited to these exemplary embodiments. Various steps in the fabrication of ICs are well known and so, in the interest of brevity, many conventional steps will only be mentioned briefly herein or will be omitted entirely without providing the well known process details. As used herein, the term "overlying" means "over" and "on," wherein "on" means in direct physical contact and "over" means such that another layer may be interposed therebetween.

FIG. 1 illustrates, in cross sectional view, a portion of the IC 10 at an intermediate stage of fabrication in accordance with an exemplary embodiment. The IC 10 includes a semiconductor substrate 12 on which shallow trench isolation (STI) structures, source/drain regions, source/drain extension regions, gate dielectric, contacts, spacers, dummy gate patterns, hard masked layers, and other features may be formed. The semiconductor substrate 12 is typically a silicon wafer and includes various doping configurations as is known in the art to define an N-channel field effect transistor (NFET) region 28 and a P-channel field effect transistor (PFET) region 30. The semiconductor substrate 12 may also include other elementary semiconductor materials such as germanium or SiGe alloy. Alternatively, the semiconductor substrate 12 may include a compound semiconductor such as silicon carbide, gallium arsenide, indium arsenide, or indium phosphide. Further, the semiconductor substrate 12 may optionally include an epitaxial layer (epi layer), may be strained for performance enhancement, and/or may include a silicon-on-isolator (SOI) structure. As used herein, the term "semiconductor substrate" will be used to encompass semiconductor materials conventionally used in the semiconductor industry from which to make electrical devices. Semiconductor materials include monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer or may be a thin layer of silicon on insulating layer (commonly known as silicon-on-insulator or SOI) that, in turn, is supported by a carrier wafer.

As shown, an interlayer dielectric material 32 is formed on the semiconductor substrate 12 by chemical vapor deposition (CVD), high-density plasma CVD, spin-on, sputtering, or any other method known to those skilled in the art. The interlayer dielectric material 32 may include silicon oxide, silicon oxynitride, or a low dielectric constant material.

The interlayer dielectric material 32 defines a first FET trench or NFET trench 14 and a second FET trench or PFET trench 18 in the respective NFET and PFET regions 28 and 30. The NFET and PFET trenches 14 and 18 may be formed by depositing the interlayer dielectric material 32 around dummy gate patterns previously formed on the semiconductor substrate 12, and then removing the dummy gate patterns. As illustrated, a layer 38 of a high dielectric constant (high-k) insulator material is deposited overlying the NFET and PFET trenches 14 and 18 by atomic layer deposition (ALD), CVD, or the like to form a gate insulator layer 38. In an exemplary embodiment, the layer 38 has a thickness of from about 1 to about 20 angstroms (Å), and the high-k insulator material includes at least one of hafnium oxide, hafnium silicate, zirconium oxide, or hafnium aluminum oxide.

Figure 2:
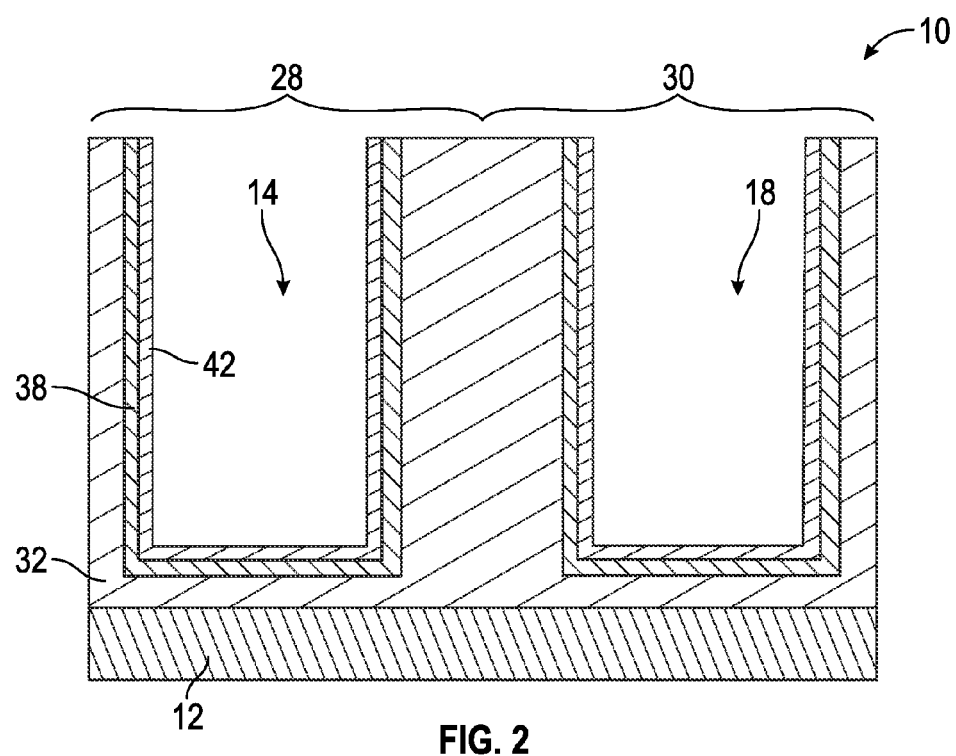

In an embodiment and referring to FIG. 2, the IC 10 is illustrated at further advanced fabrication stages in accordance with an exemplary embodiment. A barrier layer 42 of barrier material is deposited via ALD, CVD or the like in the NFET and PFET trenches 14 and 18. As illustrated, the barrier layer 42 overlies the layer 38 of the high-k insulator material. In an exemplary embodiment, the barrier layer 38 has a thickness of from about 1 to about 40 Å, such as from about 20 to about 40 Å, and the barrier material includes hafnium carbide, titanium, titanium nitride, tantalum, or tantalum nitride that can be deposited by ALD, physical vapor deposition (PVD), CVD, or the like.

Figure 3:
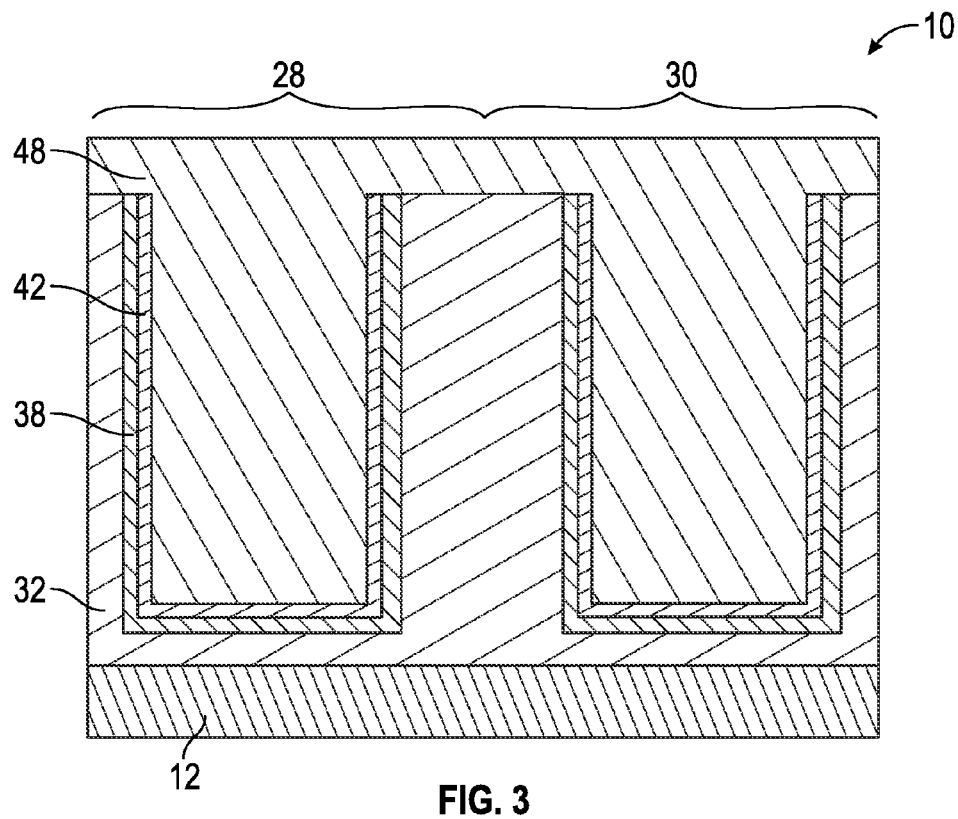

In an embodiment and referring to FIG. 3, a silicon capping layer 48 is deposited at a depth of up to about 200 Å for a partial capping and annealing (PCA) process. A process, such as rapid thermal annealing (RTA), may be utilized.

Figure 4:
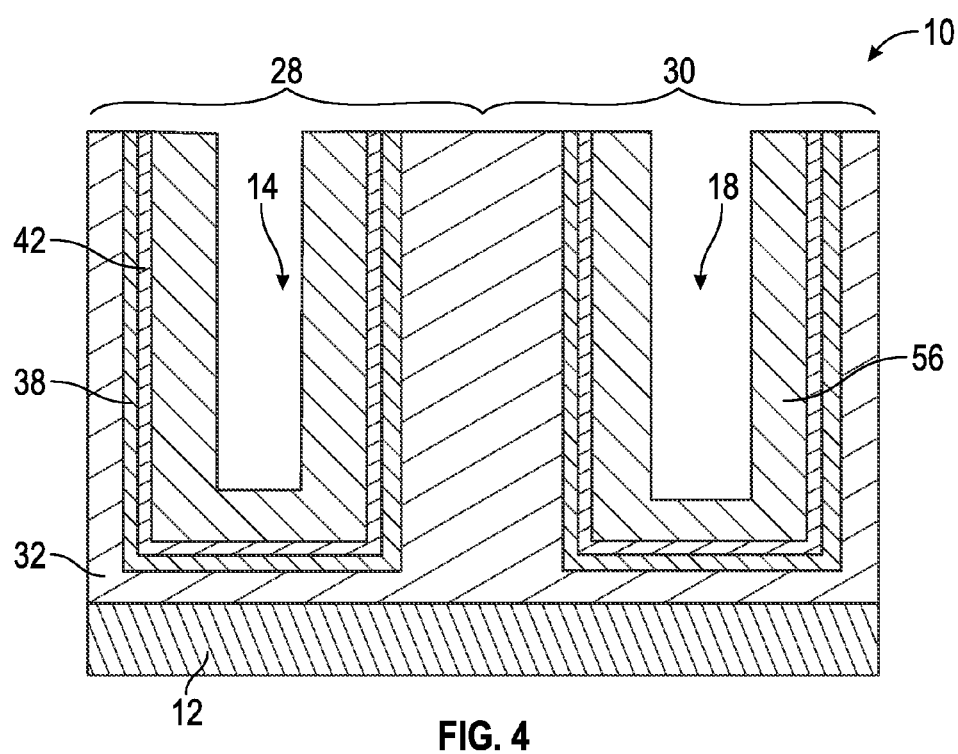
Figure 5:
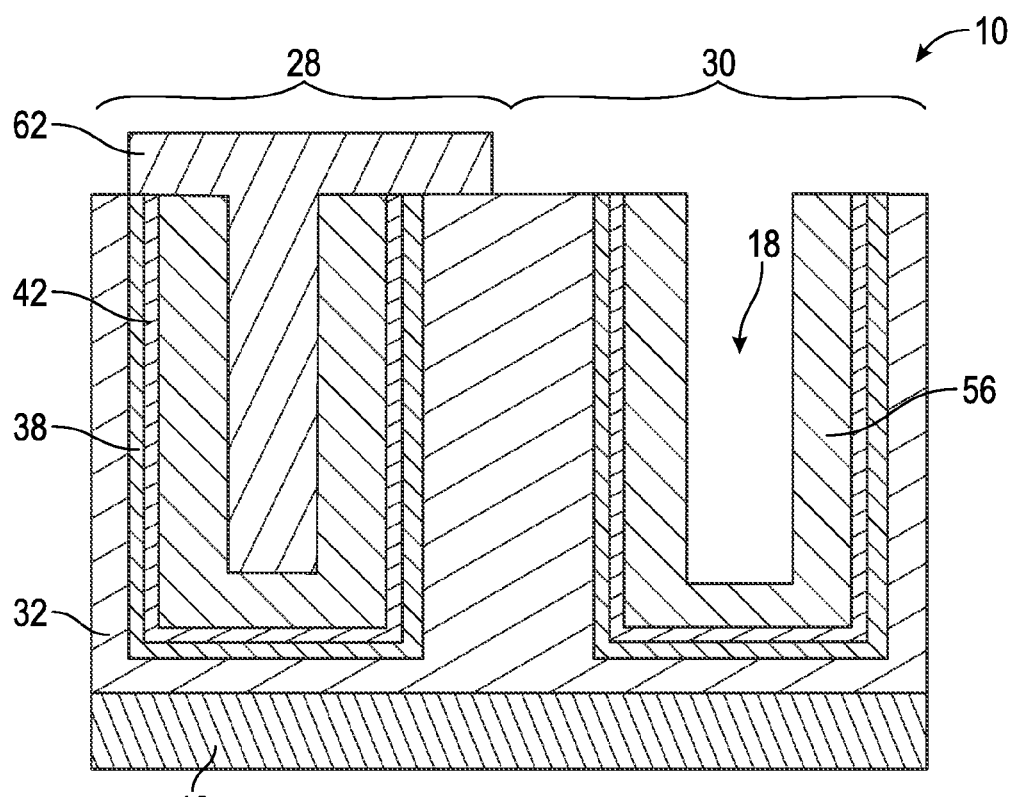
Figure 6:
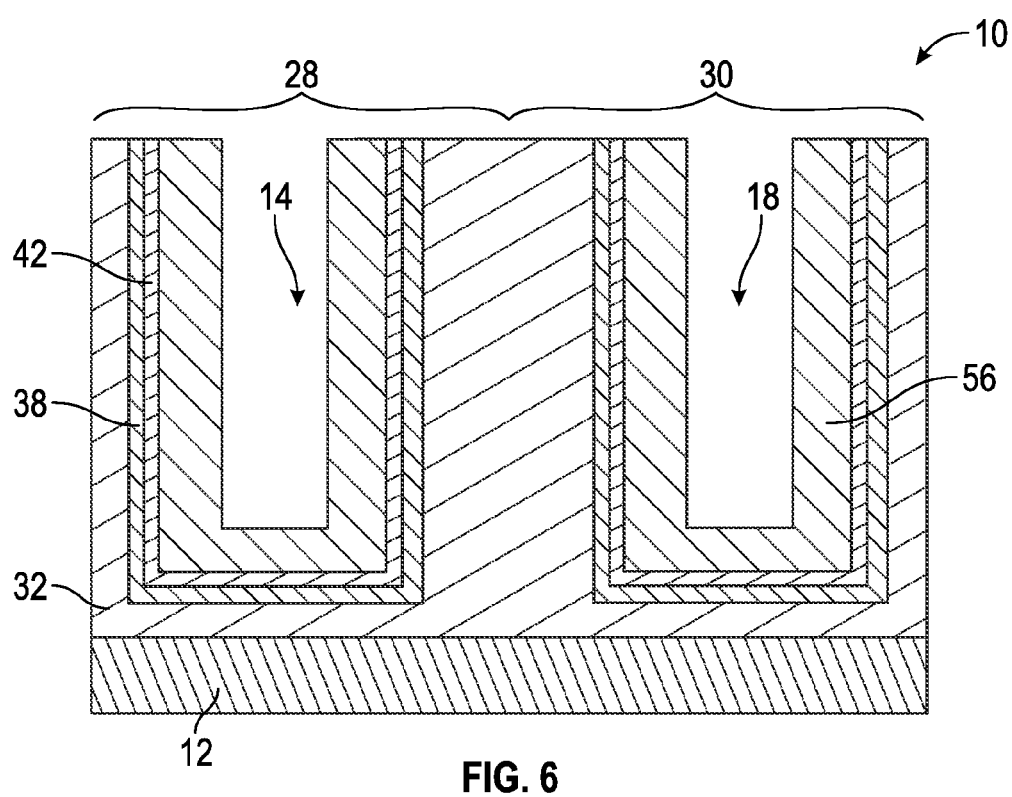

Referring to FIGS. 4-6, the process continues by removing the silicon capping layer 48 by wet etching with, e.g., ammonium hydroxide ($NH_4OH$) and depositing a work function metal forming a layer 56 overlying the layer 42 in the NFET and PFET trenches 14 and 18. In an exemplary embodiment, the work function metal is a conductive work function metal that is at least one of titanium carbide or titanium aluminum carbide. In embodiments, the same work function metal is deposited in the NFET and PFET trenches 14 and 18. The layer 56 of the work function metal may be deposited by CVD or by ALD to a thickness of from about 50 to about 90 Å, such as from about 60 to about 80 Å, or such as from about 60 to about 70 Å. The deposition of the work function metal is conformal and provides for control of the deposition thickness. Usually, the layer 56 has sufficient thickness, such as greater than about 50 Å, to resist the effects of oxidation in reducing threshold voltage. The layer 56 partially fills the NFET and PFET trenches 14 and 18. As illustrated in FIG. 5, after forming the layer 56 of the work function metal, the NFET region 28 is covered with an etch mask 62 of a photoresist material. Afterwards, a partial etching of the work function metal in the PFET trench 18 can be conducted using any suitable etchant, such as an SC1 etchant, which can be a mixture of ammonium hydroxide ($NH_4OH$), hydrogen peroxide ($H_2O_2$), and water ($H_2O$) in any suitable ratio, such as a 1:1:1 mole or weight ratio. The etchant partially removes the work function metal from the PFET trench 18. As depicted in FIG. 6, the etch mask 62 can be removed and the work function metal layer 56 in the trench 14 has a thickness of from about 50 to about 90 Å, such as from about 60 to about 80 Å, or such as from about 60 to about 70 Å, and the work function metal layer 56 in the trench 18 has a thickness of about 20 to about 40 Å, about 25 to about 35 Å, or about 30 Å.

Figure 7:
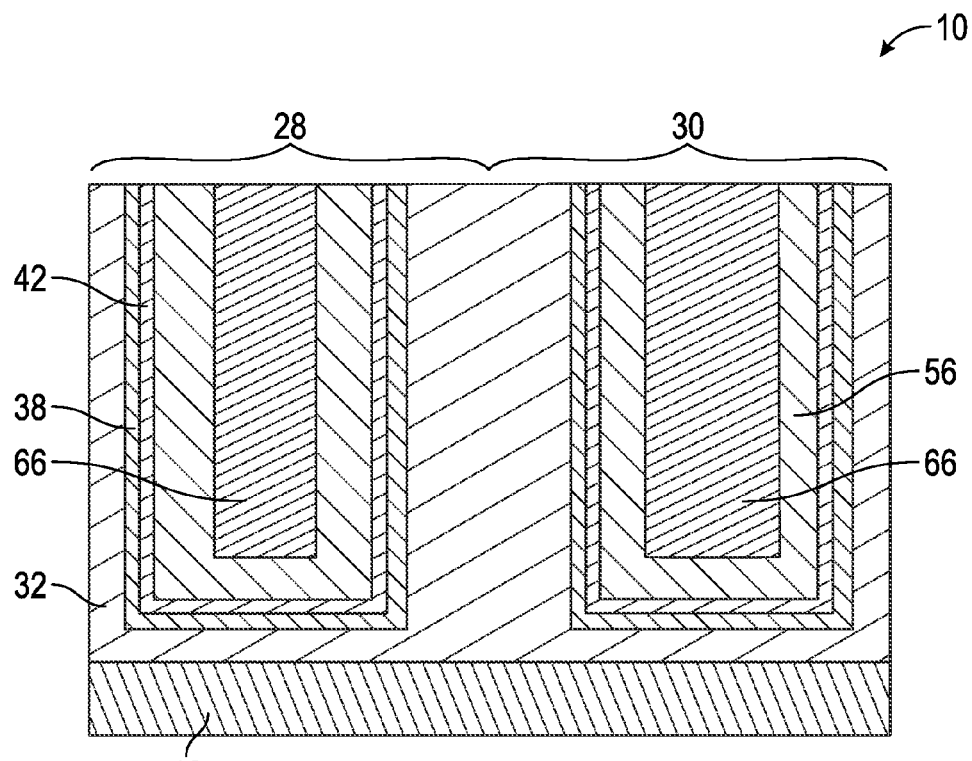

Referring to FIGS. 6 and 7, a layer 66 of a metal fill, such as tungsten, is formed in the trenches 14 and 18. Tungsten may be deposited by any suitable process, such as CVD, to a thickness of from about 200 to about 3,000 Å. Afterwards, the IC 10 can be subjected to further processing, such as chemical mechanical planarization to obtain a planarized surface.

This exemplary embodiment, as described above, generally excludes tantalum nitride, although other embodiments may include a minimum amount. In this previous embodiment, the gate structure may include a minimum amount or may exclude tantalum nitride. For example, in embodiments no more than a thickness of about 5 Å of tantalum nitride is provided as a layer on the semiconductor substrate.

Referring to FIGS. 8-13, a manufacturing method is depicted for making an integrated circuit in accordance with another exemplary embodiment. Similar components discussed above can be indicated with the same numerals as used in FIGS. 1-7. Moreover, the same steps as depicted in FIGS. 1-3 can be used to provide an IC 10 in partial fabrication.

Figure 8:
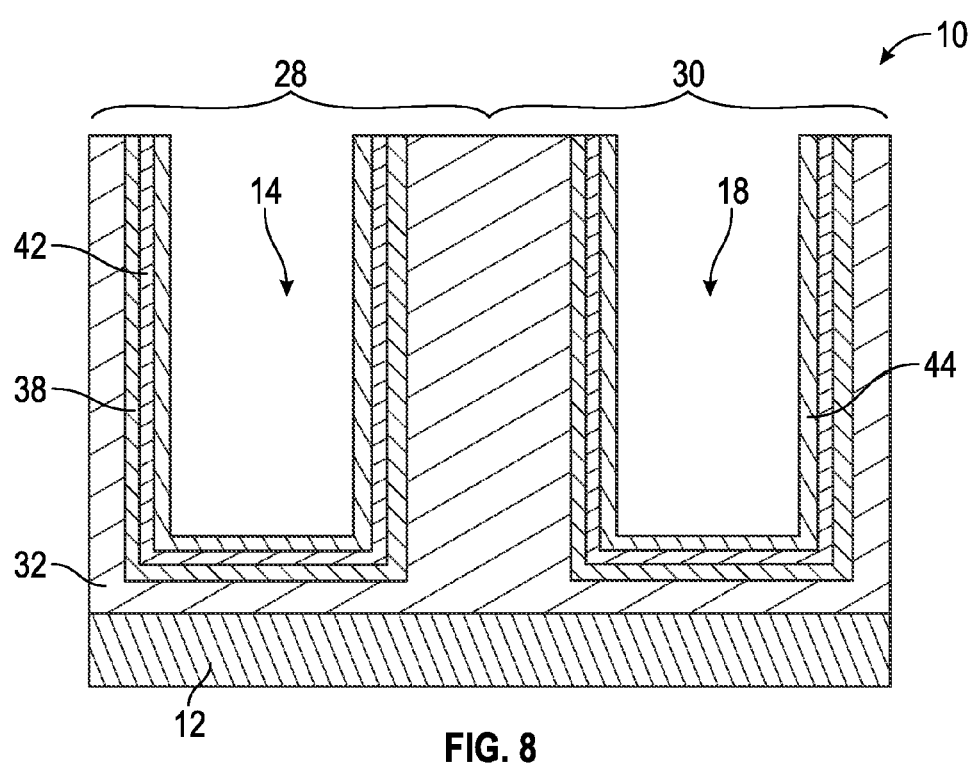
FIGS. 8-13 illustrate, in cross-section, an integrated circuit and a method for fabricating the integrated circuit according to another exemplary embodiment.

Referring to FIG. 8, the IC 10 is depicted with a layer 44 of tantalum nitride formed on the layer 42 using any suitable process such as PVD, CVD, ALD process or the like. Generally, a layer 44 of tantalum nitride is used in conjunction with a work function metal of titanium aluminum carbide, as hereinafter described. Tantalum nitride underneath the titanium aluminum carbide modulates the NFET work function metal, such as by increasing the threshold voltage as a thickness of tantalum nitride increases. The layer 44 is any suitable thickness such as no more than about 20 Å, or such as no more than about 10 Å.

Figure 9:
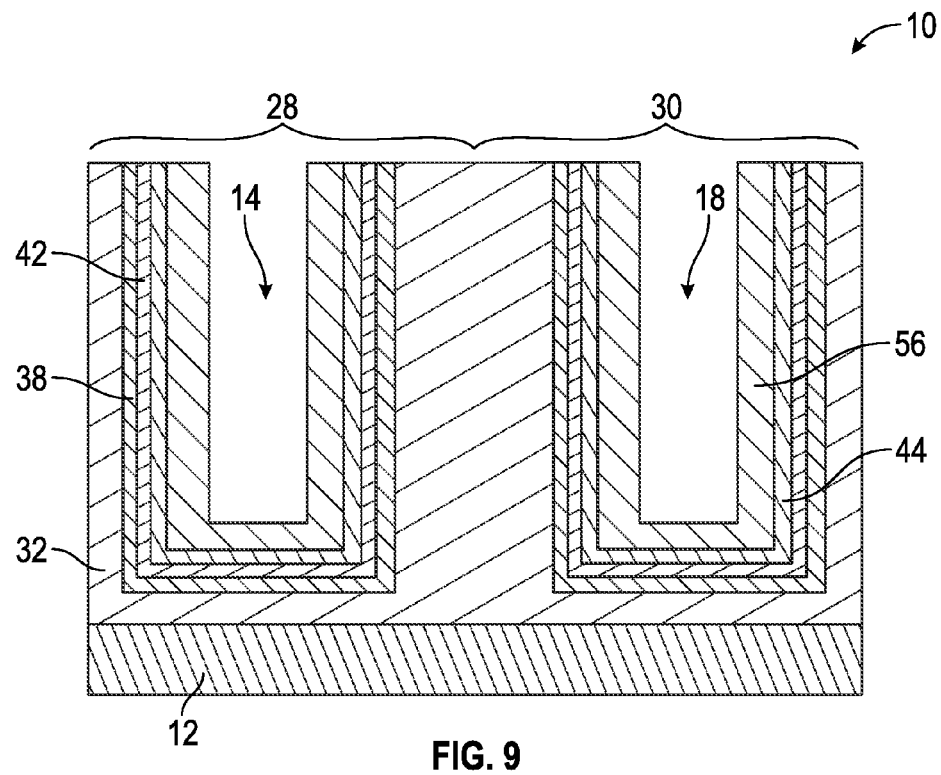

Referring to FIG. 9, depositing a work function metal to form a work function metal layer 56 of overlying the layer 44 in the NFET and PFET trenches 14 and 18. In another exemplary embodiment, the work function metal is a conductive work function metal that is at least one of titanium carbide or titanium aluminum carbide. The same work function metal may be deposited in both the NFET and PFET trenches 14 and 18. The layer 56 of the work function metal may be formed by CVD or by ALD to a thickness of from about 30 to about 60 Å, such as from about 35 to about 55 Å, or such as from about 40 to about 50 Å. The deposition of the work function metal is conformal and provides for control of the deposition thickness. The layer 56 partially fills the NFET and PFET trenches 14 and 18.

Figure 10:
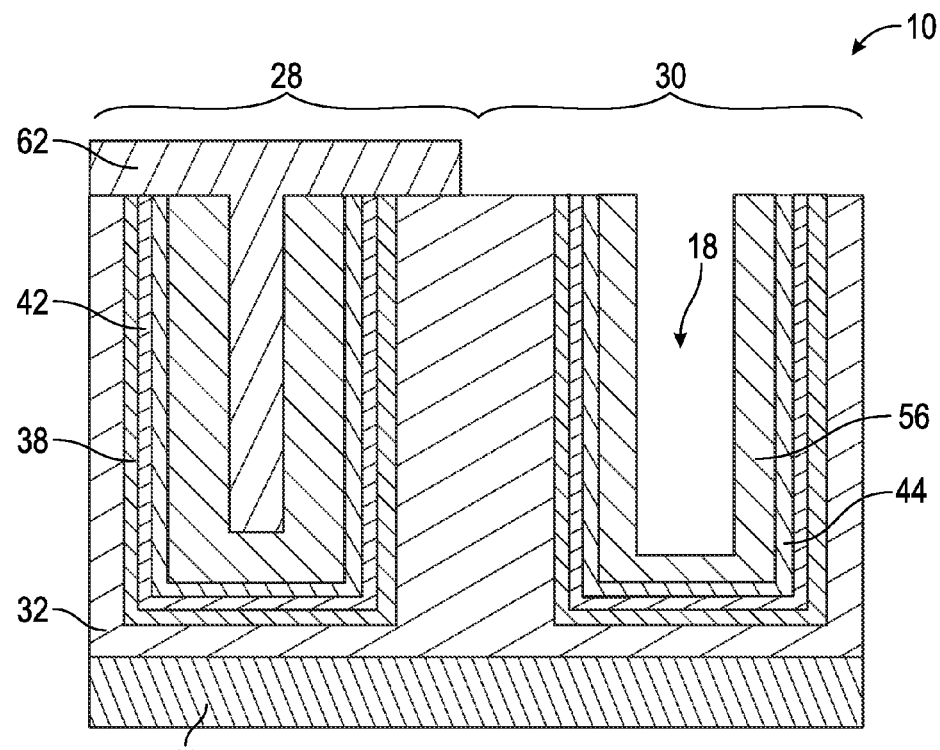
Figure 11:
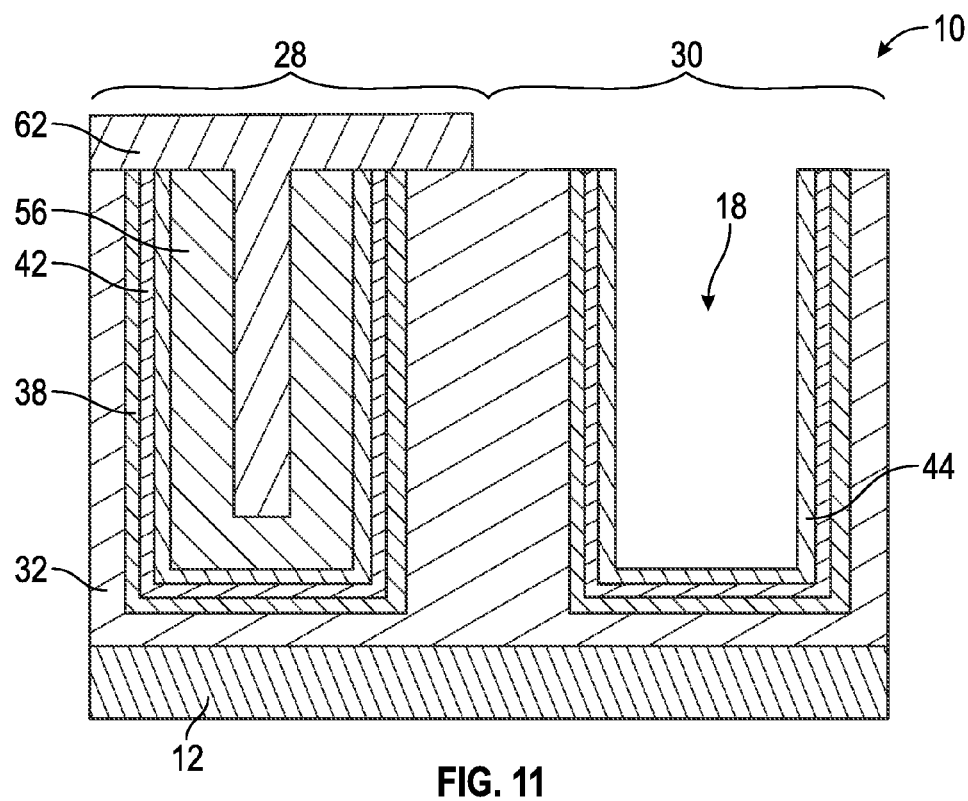

As illustrated in FIGS. 10-11, after forming the layer 56 of the work function metal, the NFET region 28 is covered with an etch mask 62 of a photoresist material. Afterwards, a partial etching of the work function metal in the PFET trench 18 can be conducted using any suitable etchant, such as an SC1 etchant, which can be a mixture of ammonium hydroxide ($NH_4OH$), hydrogen peroxide ($H_2O_2$), and water ($H_2O$) in any suitable ratio, such as a 1:1:1 mole or weight ratio. In this embodiment, the etchant at least partially removes, or completely removes the work function metal from the PFET trench 18 as depicted in FIGS. 10 AND 11.

Figure 12:
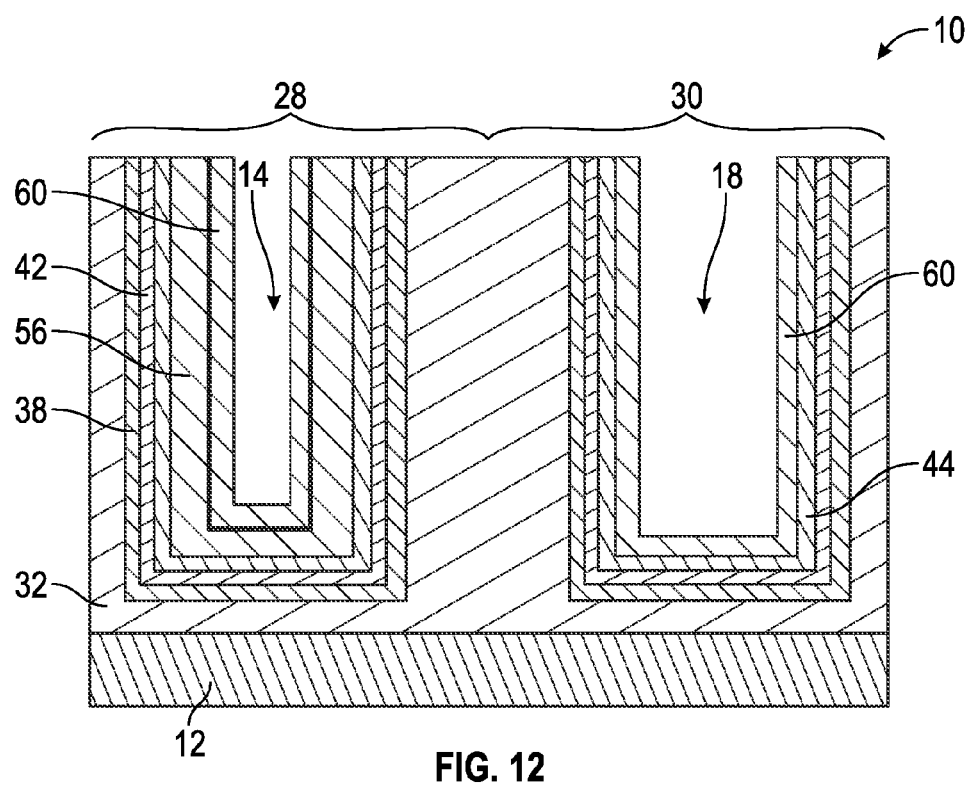

Referring to FIG. 12, the etch mask 62 can be removed and the work function metal in the NFET trench 14 can have a thickness of about 30 to about 60 Å, such as from about 35 to about 55 Å, or such as from about 40 to about 50 Å. Next, a second work function layer 60 is formed in the trenches 14 and 18 similarly to the first work function metal layer 56, using any suitable process, such as by CVD or ALD, to apply the work function metal, such as at least one of titanium carbide and titanium aluminum carbide in the trenches 14 and 18 to provide a thickness of about 20 to about 40 Å, about 25 to about 35 Å, or about 30 Å. Usually, the work function metal in the layers 56 and 60 is the same. Thus, the NFET trench 14 has two layers 56 and 60 of the work function metal and the PFET trench 18 has a single layer 60. The total thickness of the two layers 56 and 60 of the work function metal in the NFET trench 14 is about 50 to about 90 Å, about 60 to about 80 Å, or about 60 to about 70 Å, and exceeds at least about 50 Å to minimize oxidation effects, particularly for a work function metal of titanium carbide.

Figure 13:
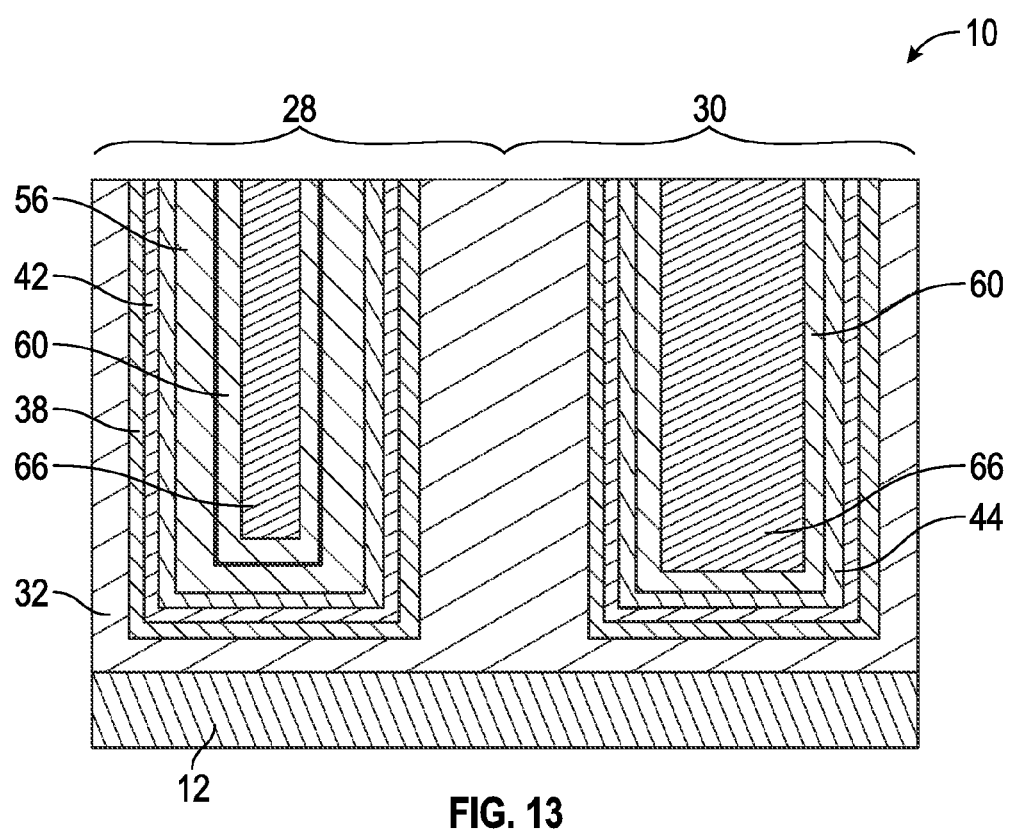

Referring to FIGS. 12 and 13, a layer 66 of a metal fill, such as tungsten, is provided in the trenches 14 and 18. Tungsten is deposited by any suitable process, such as CVD, to a thickness of from about 200 to about 3,000 Å. Afterwards, the IC 10 can be subjected to further processing, such as chemical mechanical planarization to obtain a planarized surface.

The embodiments discussed herein can provide a work function metal layer with sufficient thickness in an NFET trench to resist oxidation. Generally, an insufficient thickness of the work function metal layer can result in oxidation having an undesired increase in threshold voltage to provide effective work function, such as increasing electron voltage requirements up to about 20%.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:
1. A method for fabricating an integrated circuit, the method comprising:

forming a first FET trench in a first FET region and a second FET trench in a second FET region of an interlayer dielectric material on a semiconductor substrate;

depositing a silicon capping layer in the first FET trench and the second FET trench;

annealing the interlayer dielectric material and the semiconductor substrate after depositing the silicon capping layer with the silicon capping layer disposed in the first FET trench and the second FET trench during annealing;

removing the silicon capping layer after annealing;

at least partially filling the first and second FET trenches with a work function metal to form a work function metal layer after removing the silicon capping layer; and at least partially removing a portion of the work function metal layer in the second FET trench wherein the first FET trench is defined as an NFET trench and the second FET trench is defined as a PFET trench.

2. The method of claim 1, wherein the work function metal is at least one of titanium carbide or titanium aluminum carbide.

3. The method of claim 1, wherein, after partially filling and removing, the work function metal layer in the NFET trench has a thickness of about 50 to about 90 Å and the work function metal layer in the PFET trench has a thickness of about 20 to about 40 Å.

4. The method of claim 3, wherein the work function metal layer in the NFET trench has a thickness of about 60 to about 70 Å.

5. The method of claim 3, wherein the work function metal layer in the NFET trench comprises a first layer having a thickness of about 20 to about 40 Å, and a second layer having thickness of about 40 to about 60 Å.

6. The method of claim 3, further comprising forming a gate insulator layer of a high-k insulator material in each of the first and second FET trenches prior to partially filling the first and second FET trenches with the work function metal.

7. The method of claim 6, wherein forming the gate insulator layer comprises forming the gate insulator layer of the high-k insulator material that comprises at least one of hafnium oxide, zirconium oxide, or hafnium aluminum oxide.

8. The method of claim 6, further comprising forming a barrier layer of a barrier material overlying the high-k insulator material prior to at least partially filling the NFET trench and the PFET trench with the work function metal.

9. The method of claim 8, further comprising forming a layer in the NFET trench and the PFET trench comprising tungsten after at least partially filling with the work function metal.

10. The method of claim 8, wherein the barrier layer comprises titanium nitride.

11. The method of claim 10, further comprising forming a layer comprising tantalum nitride after forming the barrier layer.

12. The method of claim 3, wherein the work function metal layer in the NFET trench comprises a first layer having a thickness of about 20 to about 40 Å, and a second layer having thickness of about 40 to about 60 Å, and wherein the work function metal layer in the PFET trench has a thickness of about 20 to about 40 Å.

13. The method of claim 12, further comprising forming a layer in the NFET trench and the PFET trench comprising tungsten after at least partially filling with the work function metal.

14. The method of claim 1, wherein the same work function metal is used to at least partially fill the NFET and PFET trenches.

* * * * *